US008039870B2

(12) United States Patent
Burke et al.

(10) Patent No.: US 8,039,870 B2
(45) Date of Patent: Oct. 18, 2011

(54) MULTIFINGER CARBON NANOTUBE FIELD-EFFECT TRANSISTOR

(75) Inventors: Peter J. Burke, Irvine, CA (US); Steffen McKernan, San Clemente, CA (US); Dawei Wang, Irvine, CA (US); Zhen Yu, Irvine, CA (US)

(73) Assignee: RF Nano Corporation, Newport Beach, CA (US)

( * ) Notice: Subject to any disclaimer, the term of this patent is extended or adjusted under 35 U.S.C. 154(b) by 736 days.

(21) Appl. No.: 12/021,042

(22) Filed: Jan. 28, 2008

(65) Prior Publication Data

US 2009/0189146 A1 Jul. 30, 2009

(51) Int. Cl.
*H01L 29/66* (2006.01)
(52) U.S. Cl. ......... 257/192; 257/236; 977/742; 977/936
(58) Field of Classification Search ................... 257/192, 257/236, E51.04, E31.073; 977/742, 936
See application file for complete search history.

(56) References Cited

U.S. PATENT DOCUMENTS

| 6,515,339 | B2 | 2/2003 | Shin |
| 6,918,284 | B2 | 7/2005 | Snow |
| 7,098,510 | B2 | 8/2006 | Kodama |
| 7,279,375 | B2 * | 10/2007 | Radosavljevic et al. ...... 438/197 |
| 2008/0017899 | A1 * | 1/2008 | Appenzeller et al. ......... 257/288 |

OTHER PUBLICATIONS

PCT International Search Report, Mar. 25, 2009, 3 Pages.
P.J. Burke, Solid State Electronics 40, 1981 (2004).
Khairul Alam and Roger Lake, Applied Physics Letters 87, 073104 (2005).
J. Guo, S. Hasan, A. Javey, G. Bosman, and M. Lundstrom, "Assessment of High-Frequency Performance Potential of Carbon Nanotube Transistors", IEEE Transactions on Nanotechnology 4, 715-721 (2005).
L. C. Castro, D. L. John, D. L. Pulfrey, M. Pourfath, A. Gehring, and H. Kosina, IEEE Transactions on Nanotechnology 4, 699 (2005).
S. Hasan, S. Salahuddin, M. Vaidyanathan, and A. A. Alam, IEEE Transactions on Nanotechnology 5, 14 (2006).
Zhen Yu and Peter Burke, Proc. SPIE Int. Soc. Opt. Eng. 5790, 246 (2005).
Sunkook Kim; Tae-young Choi; Laleh Rabieirad; Jong-Hyeok Jeon; Moonsub Shim; Saeed Mohammadi; Microwave Symposium Digest, 2005 IEEE MTT-S International4 (2005).
Min Zhang, Xiao Huo, Philip C. H. Chan, Qi Liang, and Z. K. Tang, IEEE Electron Device Letters 27, 668 (2006).
J.-M. Bethoux, H. Happy, A.Siligaris, G. Dambrine, J. Borghetti., V. Derycke, and J.-P. Bourgoin, IEEE Transactions on Nanotechnology 5, 335 (2006).
J.-M. Bethoux, H. Happy, G. Dambrine, V. Derycke, M. Goffman, and J.-P. Bourgoin, IEEE Electron Device Letters 27, 681 (2006).

(Continued)

*Primary Examiner* — Michael Shingleton
(74) *Attorney, Agent, or Firm* — Greenberg Traurig LLP; Bradley D. Blanche

(57) ABSTRACT

A multifinger carbon nanotube field-effect transistor (CNT FET) is provided in which a plurality of nanotube top gated FETs are combined in a finger geometry along the length of a single carbon nanotube, an aligned array of nanotubes, or a random array of nanotubes. Each of the individual FETs are arranged such that there is no geometrical overlap between the gate and drain finger electrodes over the single carbon nanotube so as to minimize the Miller capacitance (Cgd) between the gate and drain finger electrodes. A low-K dielectric may be used to separate the source and gate electrodes in the multifinger CNT FET so as to further minimize the Miller capacitance between the source and gate electrodes.

8 Claims, 10 Drawing Sheets

OTHER PUBLICATIONS

David M. Pozar, Microwave Engineering, 3rd ed. (J. Wiley, Hoboken, NJ, 2005), pp. xvii.

S. Li, Z. Yu, S. F. Yen, W. C. Tang, and P. J. Burke, Nano Letters 4, 753 (2004).

Zhen Yu, Christopher Rutherglen, and Perter Burke, Applied Physics Letters 88, 233115 (2006).

J. Appenzeller and D. J. Frank, Applied Physics Letters 84, 1771 (2004).

D. J. Frank and J. Appenzeller, IEEE Electron Device Letters 25, 34 (2004).

Sami Rosenblatt, Hao Lin, Vera Sazonova, Sandip Tiwari, and Paul McEuen, Applied Physics Letters 87, 15311 (2005).

A. A. Pesetski, J. E. Baumgardner, E. Folk, J. X. Przybysz, J. D. Adam, and H. Zhang, Applied Physics Letters 88, 113103 (2006).

Zhen Yu, Shengdong Li, and P. J. Burke, Chemistry of Materials 16, 3414 (2004).

Shengdong Li, Zhen Yu, Christopher Rutherglen, and P. J. Burke, Nano Letters 4, 2003 (2004).

Guillermo Gonzalez, Microwave Transistor Amplifiers: Analysis and Design, 2nd ed. (Prentice Hall, Upper Saddle River, N. J., 1997), pp. x.

A. Javey et al., "Self-Aligned Ballistic Molecular Transistors and Electrically Parallel Nanotube Arrays", Nano Letters, 4, 1319-1322 (2004).

J. Hone et al., "Growth of Nanotubes and Chemical Sensor Applications," Proceedings of the SPIE (2005).

Z. Yu, Chris Rutherglen, Shengdong Li and P. J. Burke, "Using Ultra-Long Nanotubes to Make Identical CNT FETs", NTSI-Nanotech 2005 Proceedings, 3, 123, (2005).

\* cited by examiner

MULTIFINGER CARBON NANOTUBE FIELD-EFFECT TRANSISTOR

TECHNICAL FIELD

This disclosure relates generally to the field of nanotube devices and, more particularly, to a multifinger carbon nanotube field-effect transistor (CNT FET).

BACKGROUND

Theoretically, single-walled carbon nanotube field-effect transistors (SWNT FETs) are predicted to have intrinsic cut-off frequencies approaching the THz range, where intrinsic means that the parasitic capacitance due to fringing fields is negligible compared to the gate-source capacitance required to modulate the conductance. However, in real world applications, this parasitic capacitance tends to dominate most CNT FET geometries.

When fabricating an individual CNT FET, it would beneficial to be able to measure its full S-parameters (or equivalently Z, h, or ABCD matrix), and then come up with an equivalent circuit model that could then be compared to theoretical models and used as basis to construct more complex circuits out of more than one CNT FET. However, in practice, the high impedance and low on current of a single CNT FET have served to hinder prior attempts to obtain these measurements.

SUMMARY

According to a feature of the disclosure, a nanotube device with multiple finger electrodes on a single nanotube is provided. In one or more embodiments, the nanotube device comprises a multifinger carbon nanotube field-effect transistor (CNT FET) in which a plurality of nanotube top gated FETs are combined in a finger geometry using one length of a single walled carbon nanotube. In one or more embodiments, a low-K dielectric can be used to separate source and gate electrodes in the multifinger CNT FED so as to minimize the capacitance (i.e., the Miller capacitance) between the source and gate electrodes.

According to another feature of the disclosure, a nanotube device is provided comprising a multifinger carbon nanotube field-effect transistor (CNT FET) in which multiple nanotubes are formed between the source and drain finger electrodes, wherein the multiple nanotubes may be aligned or formed randomly.

In one or more embodiments, using one individual 100 µm long single walled carbon nanotube, 100 individual nanotube top gated field effect transistors are combined in a finger geometry to produce a single transistor with a cutoff frequency (after de-embedding parasitic capacitance of the finger structure) of 7.65 GHz; before de-embedding the cutoff frequency is 0.2 GHz. The maximum stable gain value after de-embedding falls to unity at over 15 GHz (extrapolated), and before de-embedding it falls to unity at 2 GHz (measured). With such a configuration, a dc power of >1 mW and a transconductance (dc) of over 1.5 mS is sustained by the combined device. A multifinger carbon nanotube field-effect transistor (CNT FET) formed in accordance with the various embodiments described herein represents a significant advance that allows nanotube technology to be utilized in RF and microwave frequency applications.

According to yet another feature of the disclosure, the nanotube device with multiple finger electrodes is used in a circuit in order to amplify RF signals and drive a 50 ohm load, thereby providing a nanotube amplifier driving a 50 ohm load.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
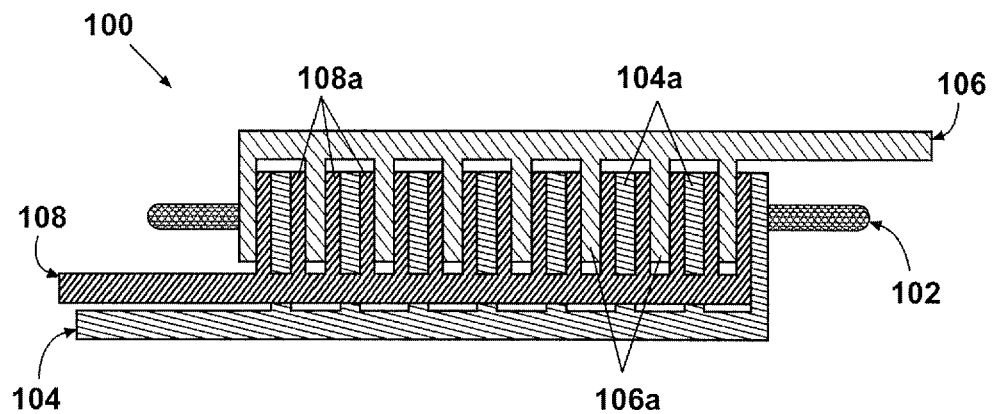
FIG. 1 is a schematic layout of a multifinger carbon nanotube field-effect transistor (CNT FET) in accordance with one embodiment of the present disclosure.

The present disclosure is directed to a multifinger carbon nanotube field-effect transistor (CNT FET) and a method of making the same. In one or more embodiments, a multifinger carbon nanotube field-effect transistor (CNT FET) 100 is provided having a plurality of finger electrodes on a single nanotube 102, as illustrated in the schematic layout illustration of FIG. 1. The multifinger CNT FET 100 includes a source 104, a drain 106 and a gate 108 having finger electrodes 104a, 106a and 108a respectively extending there from positioned over the nanotube 102.

In one or more embodiments, the nanotube 102 is a length of carbon nanotube (CNT) that is synthesized via chemical vapor deposition according to any CNT recipes known to those skilled in the art. The CNT 102 is deposited on an oxidized high resitivity Si wafer having a dielectric layer formed thereon (e.g., a 300-400 nm SiO2 layer). The metal electrodes (source 104, drain 106, a gate 108 and respective finger electrodes 104a, 106a and 108a) are formed on the CNT 102 using electron-beam lithography and metal evaporation. In one or more embodiments, the metal electrodes comprise a of 30-nm Pd/100 nm Au bilayer. Evaporated silicon dioxide (e.g, having a thickness of 10 nm) serves as an insulator, and a Au top-gate is evaporated. The width of the gate finger electrodes 108a are less than the gap between the source finger electrodes 104a and drain finger electrodes 106a, such that portions of the length of the nanotube 102 are not gated.

Figure 2:
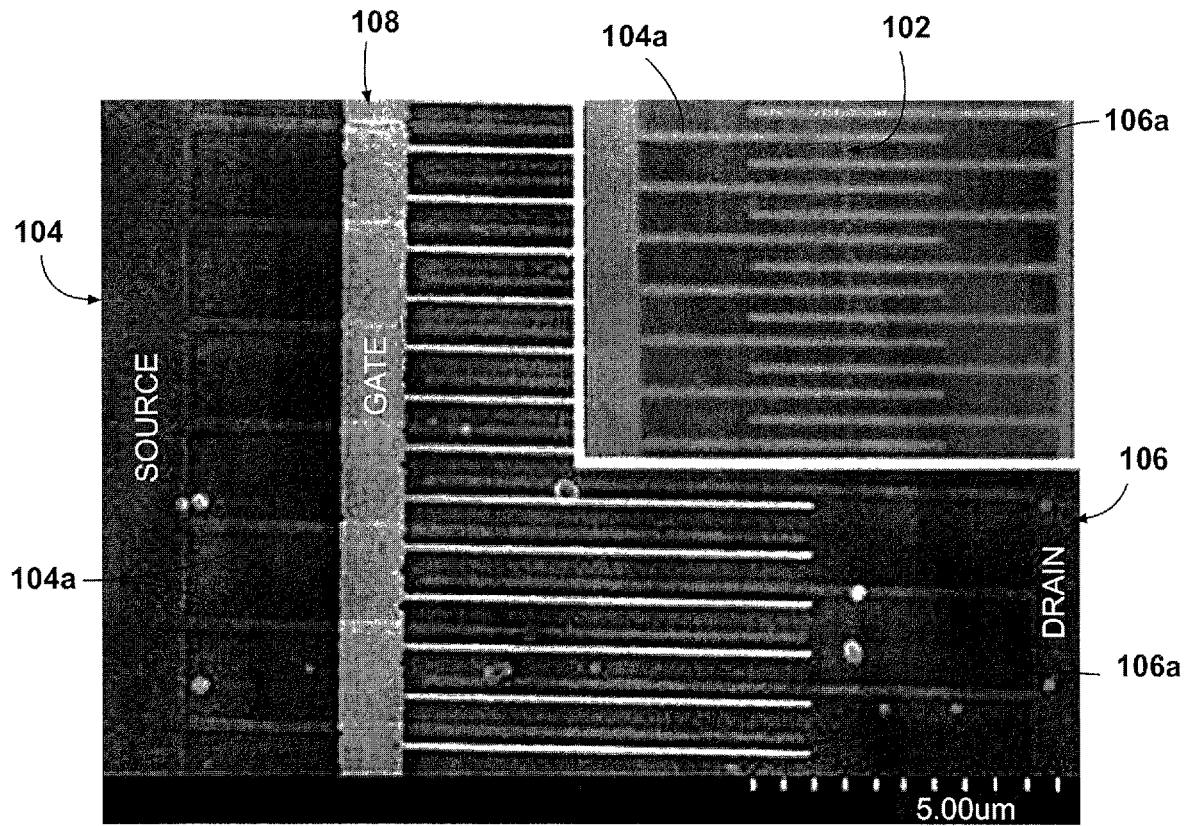
FIG. 2 is an SEM image of one embodiment of a multifinger carbon nanotube field-effect transistor (CNT FET) in accordance with one embodiment of the present disclosure.

For example, the source-drain gaps 110 can be formed to be approximately 0.8 µm while the width of the gate finger electrodes 108a are approximately 0.2 µm. An SEM image of a portion of one embodiment of such a multifinger CNT FET 100 possessing such dimensions is shown in FIG. 2. In the SEM image, the nanotube 102 is visible in the upper right inset before the dielectric (not shown) is deposited. After the dielectric and top-gate have been deposited, the nanotube 102 is not visible in the SEM image.

In one or more embodiments, a total of 2x gate finger electrodes 108a, x source finger electrodes 104a (sourcing current in both directions) and x drain finger electrodes 106a (sinking current in both directions), where x>1, were connected electrically together on-chip as described herein for a combined total of 2x CNT FETs connected electrically in parallel to form the multifinger CNT FET 100. In one embodiment, x=50 is selected to provide 100 gate finger electrodes 108a, 50 source finger electrodes 104a and 50 drain finger electrodes 106a electrically connected together for a combined total of 100 individual CNT FETs connected in parallel. Since each individual CNT FET is fabricated with nominally the same geometry on the same nanotube 102, the electrical properties of each individual CNT FET are expected to be identical. By combining "on-chip" the electrical properties of the individual CNT FETs (e.g., 100) fabricated on one long nanotube 102, nanotube transistor performance with maximum stable gain above 1 GHz (even including the parasitics) can by achieved while also solving the problem of impedance matching by boosting the on current to a large (mA) value. The source/drain/gate electrodes 104a/106a/108a can then be connected to industry standard coplanar waveguide structures (not shown) for compatibility with a commercial RF probe station.

Figure 3A:
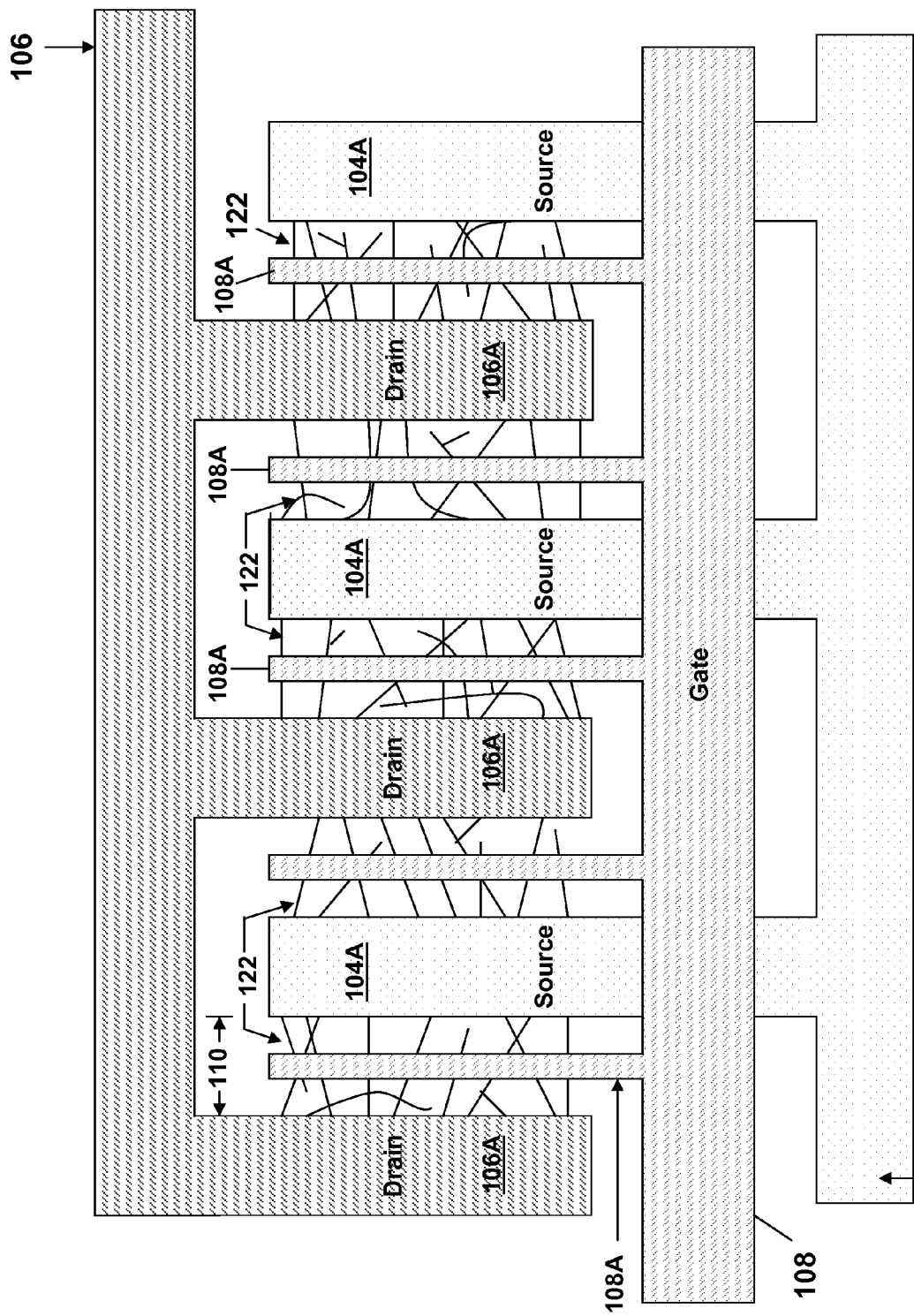
FIG. 3A is a schematic layout of a multifinger carbon nanotube field-effect transistor (CNT FET) in accordance with one embodiment of the present disclosure.
Figure 3B:
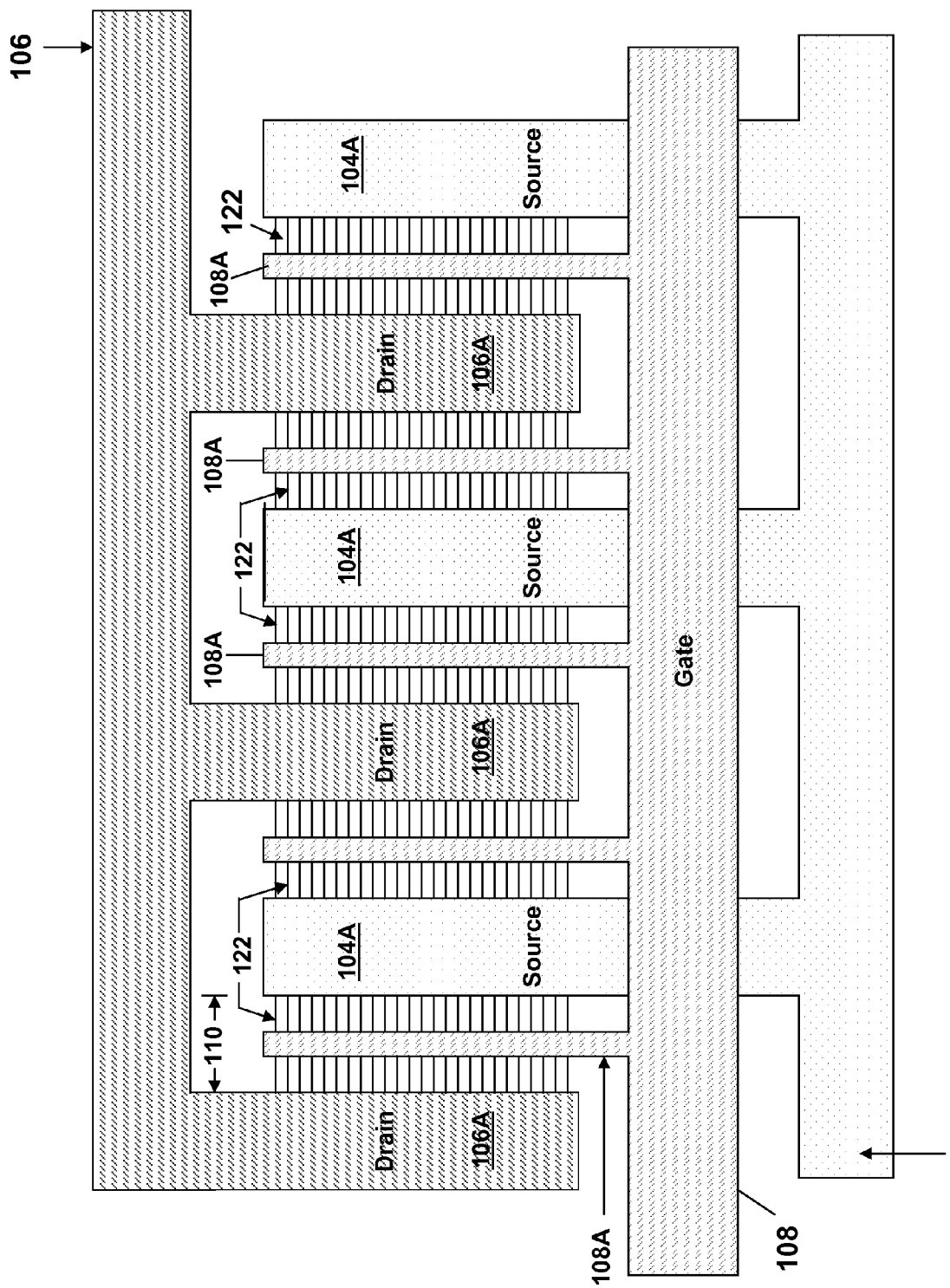
FIG. 3B is a schematic layout of a multifinger carbon nanotube field-effect transistor (CNT FET) in accordance with one embodiment of the present disclosure.

In one or more embodiments, a nanotube device 120 that uses the same electrode geometry but multiple nanotubes 122 can used instead of a single nanotube 102. For instance, multiple randomly oriented SWNTs 122 can be formed between the source 104 and drain 106, as shown schematically in FIG. 3A, or an array of multiple aligned SWNTs 122 can be formed between the source 104 and drain 106, as shown schematically in FIG. 3B. The nanotube device 120 formed with multiple nanotubes 122 will otherwise be formed and function similarly to the multifinger CNT FET 100 described in connection with FIG. 1.

In one or more embodiments, the multifinger CNT FET 100 formed with such a multifinger electrode geometry will minimize the Miller effect on the device. The Miller effect causes the effective capacitance between the gate 108 and the drain 106 (Cgd) to be much larger at the input, by a factor of (1+gain). Therefore, the Miller capacitance (Cgd) needs to be kept to a minimum in order to keep the frequency response to a maximum. The multifinger CNT FET 100 realizes this prevention of the Miller effect, not previously realized in conventional CNT FET devices, by providing a configuration with no geometrical overlap between the gate finger electrodes 108a and drain finger electrodes 106a. In one or more embodiments, the Miller effect can further be reduced by utilizing a low-K dielectric to separate the source/gate electrodes 104/106 so as to minimize capacitance between the two electrodes 104/106. By using a low-K dielectric to separate the gate-source electrodes 104/106, the capacitance (Cgs) between the gate 104 and the source 106 is minimized so as to maximize device high frequency properties.

In one or more embodiments, the finger electrodes 104a/106a/108a are formed to be relatively short (e.g., less than approximately a few microns) and the lead electrodes 104/106/108 contacting them are formed to be wider (e.g., wider than a few microns) in order to minimize the resistance of the lead electrodes 104/106/108, where the gate 108 resistance and the lead electrode inductance are particularly minimized.

Figure 4A:
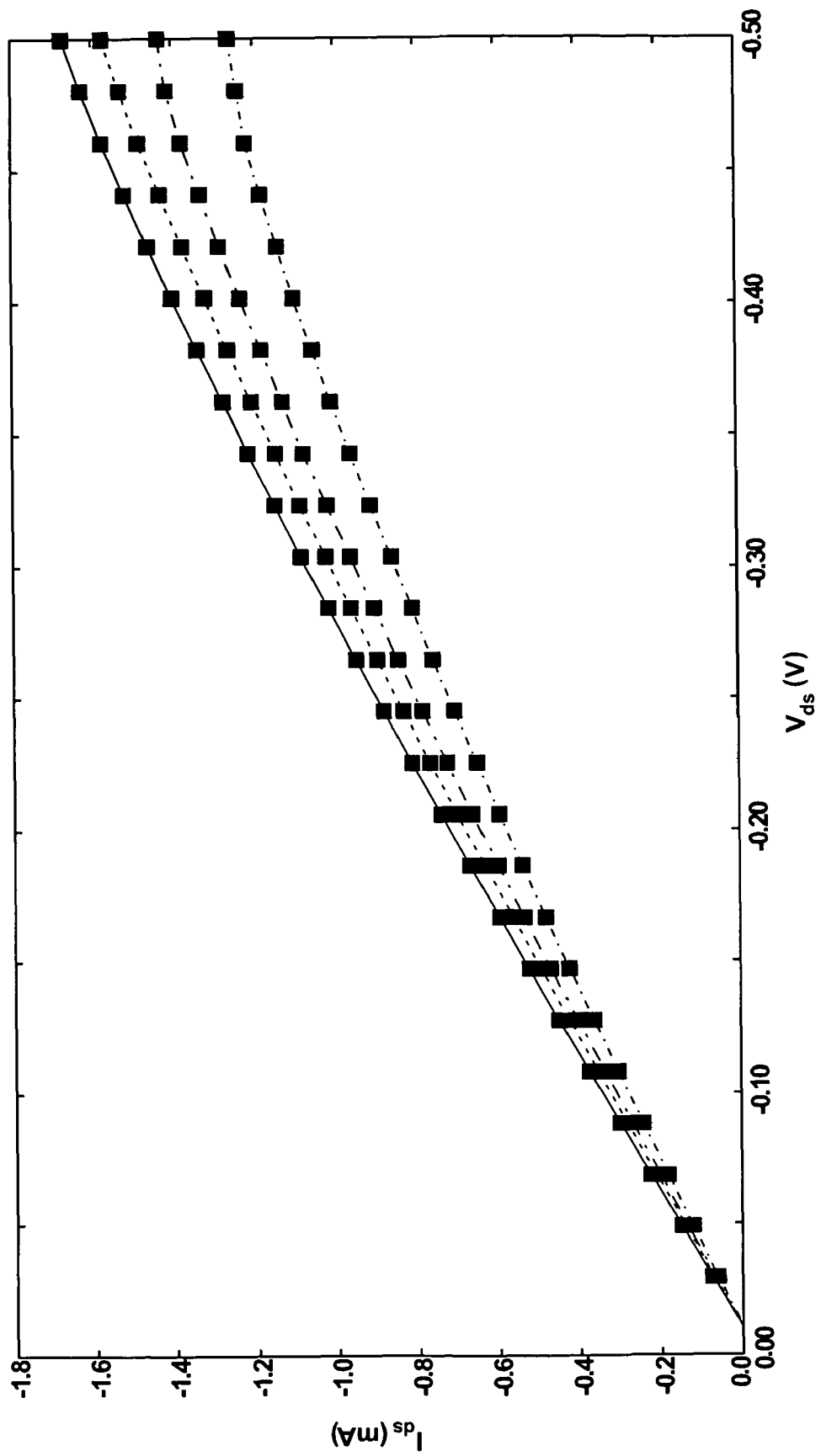
FIG. 4A shows the room temperature I-V characteristics measured from an exemplary multifinger carbon nanotube field-effect transistor (CNT FET) formed in accordance with the present disclosure.
Figure 4B:
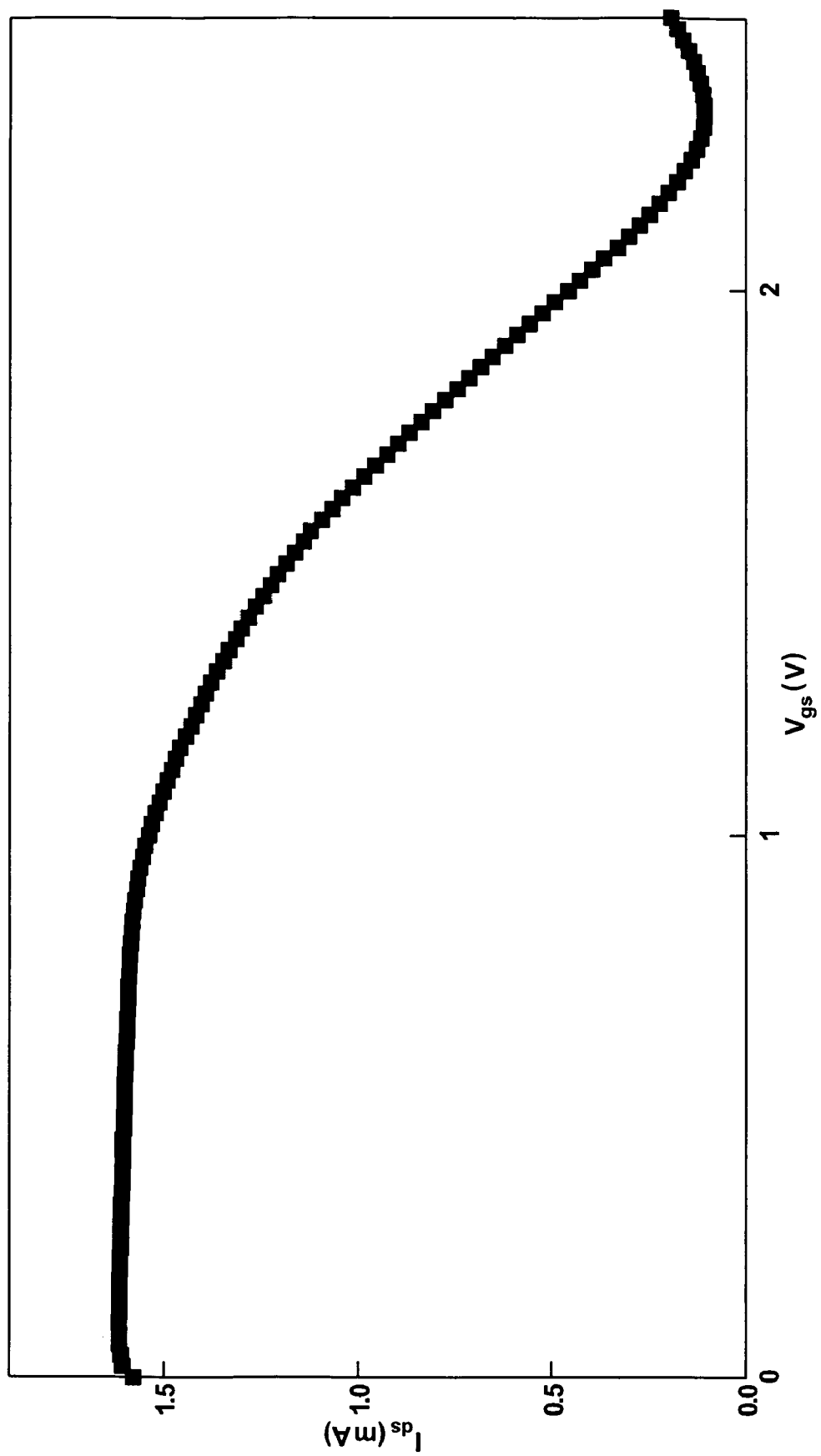
FIG. 4B illustrates the low-bias depletion curve at $V_{ds}=0.5V$ for the exemplary multifinger carbon nanotube field-effect transistor (CNT FET) of FIG. 4A.
Figure 4C:
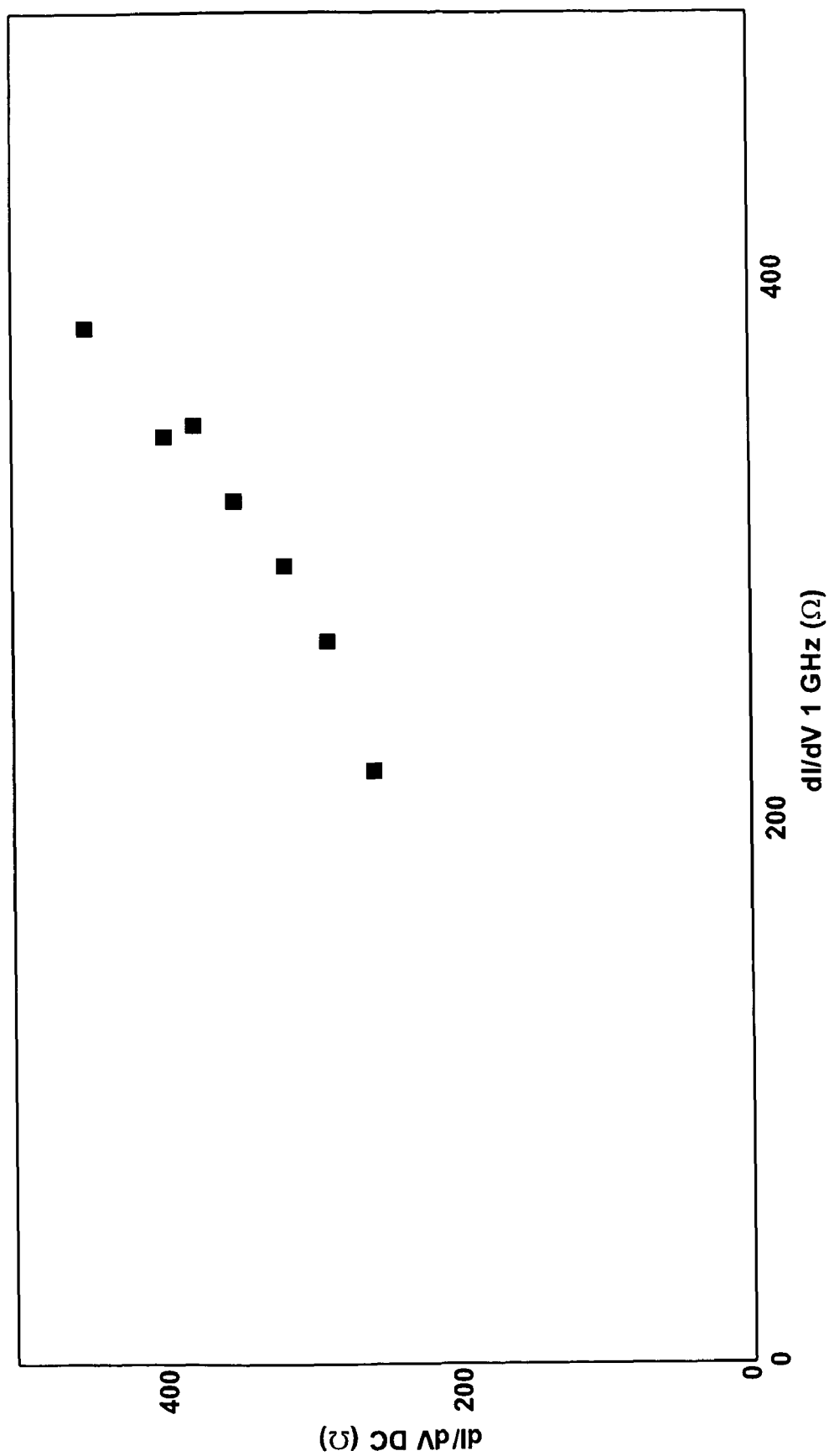
FIG. 4C illustrates DC and 1 GHz $dI_{ds}/dV_{ds}$ values under various bias conditions for the exemplary multifinger carbon nanotube field-effect transistor (CNT FET) of FIG. 4A.

Referring now to FIG. 4A, the room temperature I-V characteristic measured from an exemplary multifinger CNT FET 100 device formed in accordance with one or more embodiments is illustrated. FIG. 4B further illustrates the low-bias depletion curve, while FIG. 4C illustrates DC and 1 GHz $dI_{ds}/dV_{ds}$ under various bias conditions. In addition, FIG. 4C illustrates the differential resistance at dc (from the measured I-V curves) versus the differential resistance from the measured microwave S-parameters (as further described below). The results illustrated in FIGS. 4A-4C are favorable: under a variety of bias conditions, the dynamical source-drain impedance is the same at 1 GHz as it is at dc. These results are consistent with prior measurements of the same quantity that were performed on a FET made from an individual nanotube segment.

In one or more embodiments, for RF characterization of the multifinger CNT FET 100, microwave measurements of the multifinger CNT FET 100 can performed using commercially available microwave probes (suitable for calibration with a commercially available short/open/load/through (SOLT) calibration standard) and were allowed for transition from coax to lithographically fabricated on-chip coplanar waveguide (CPW) electrodes. A microwave network analyzer can be used to measure the fully calibrated (complex) S parameters ($S_{11}$, $S_{12}$, $S_{21}$, $S_{22}$). A SOLT calibration procedure can be used on a commercial calibration wafer.

Figure 5:
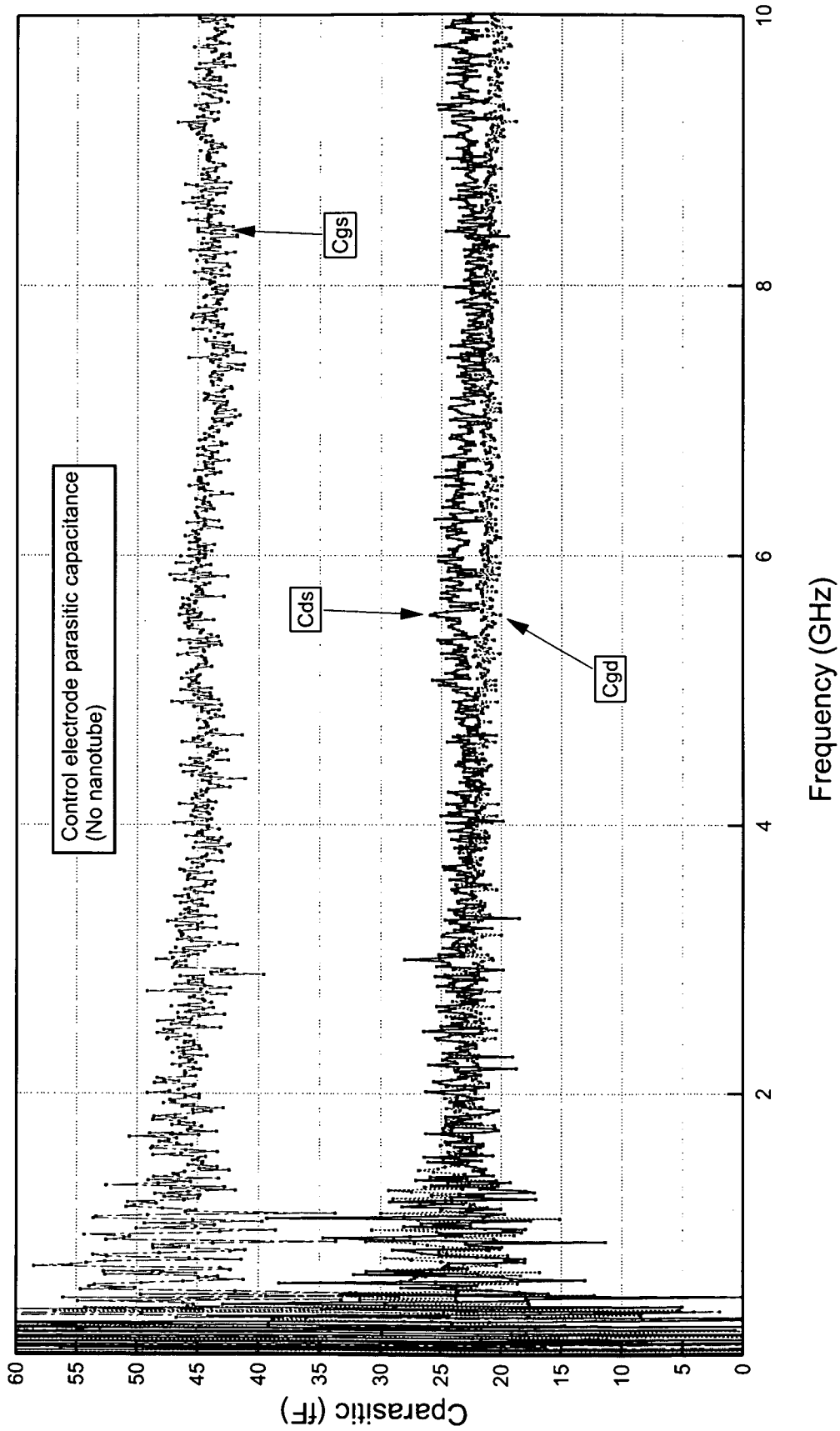
FIG. 5 is a graphical representation of the measured electrode capacitances of an exemplary multifinger carbon nanotube field-effect transistor (CNT FET) formed in accordance with the present disclosure.

In one or more embodiments, the calibration standard wafer should not have the multifinger geometry of the multifinger CNT FET 100, so that, by measuring the S-parameters of a control device without any nanotubes, the parasitic capacitance due to the finger electrodes 104a/106a/108a (which is predominantly due to the fringing electric fields between these finger electrodes 104a/106a/108a) can be accurately determined. From the measured S-parameters on the control finger device, the Y-matrix and then the capacitance (using the appropriate forms of the basic relationship $Y=i\omega c$) can be determined. From these values, the three parasitic capacitances Cgs, Cgd, Cds can be determined, which are plotted in the graphical representation of FIG. 5. From the plots in FIG. 5, a frequency independent capacitance is clearly shown, verifying the calibration and the model for the parasitics, where the absolute values agree well with calculated capacitances based on the electrode geometry.

The common figure of merit for characterizing high frequency (HF) transistors is the cut-off frequency, defined as the frequency at which the current gain ($H_{21}$) falls to 0 dB. In one or more embodiments of the multifinger CNT FET 100, because the parasitic capacitance is large compared to the gate-source capacitance required to modulate the conductance, the cut-off frequency is limited. By measuring the entire S-parameters of the multifinger CNT FET 100, a technique is provided that extracts a cut-off frequency for the complete multifinger CNT FET 100 device of 0.2 GHz, as shown in graphical illustration of FIG. 6.

Figure 6:
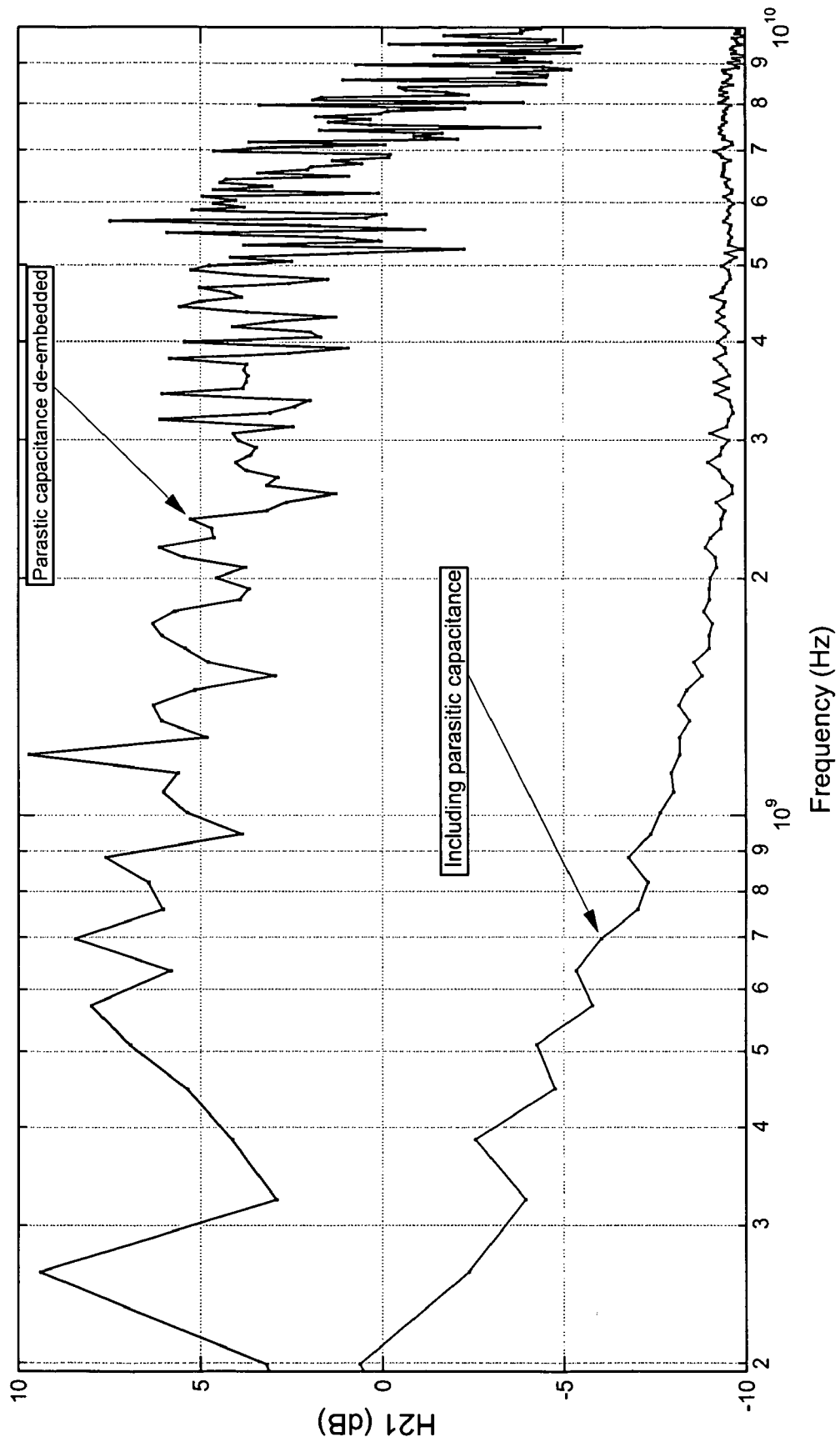
FIG. 6 is a graphical representation of the current gain vs. frequency of an exemplary multifinger carbon nanotube field-effect transistor (CNT FET) formed in accordance with the present disclosure.

Since the parasitic capacitances (Cgs, Cgd, Cds) are known, these can be "subtracted off" to determine the "intrinsic" performance of the multifinger CNT FET 100. Again, "intrinsic" means that the parasitic capacitance due to fringing fields is negligible compared to the gate-source capacitance required to modulate the conductance. In practice this de-embedding procedure is carried out by taking the measured Y matrix and subtracting the control (open) Y-matrix of the electrode fingers 104a/106a/108a only (determined in a separate matrix), resulting in the "intrinsic" Y-matrix: $Y_{intrinsic}=Y_{measured}-Y_{control}$. Then, $Y_{intrinsic}$ can by used to find the intrinsic (de-embedded) S, h, Z, and ABCD matrix. After performing this procedure, an intrinsic cut-off frequency (the frequency at which the de-embedded current gain $H_{21}$ drops to 0 dB) of 7.65 GHz is found in one embodiment, as shown in FIG. 6. This represents one of the largest cut-off frequencies ever measured on a nanotube FET.

Figure 7:
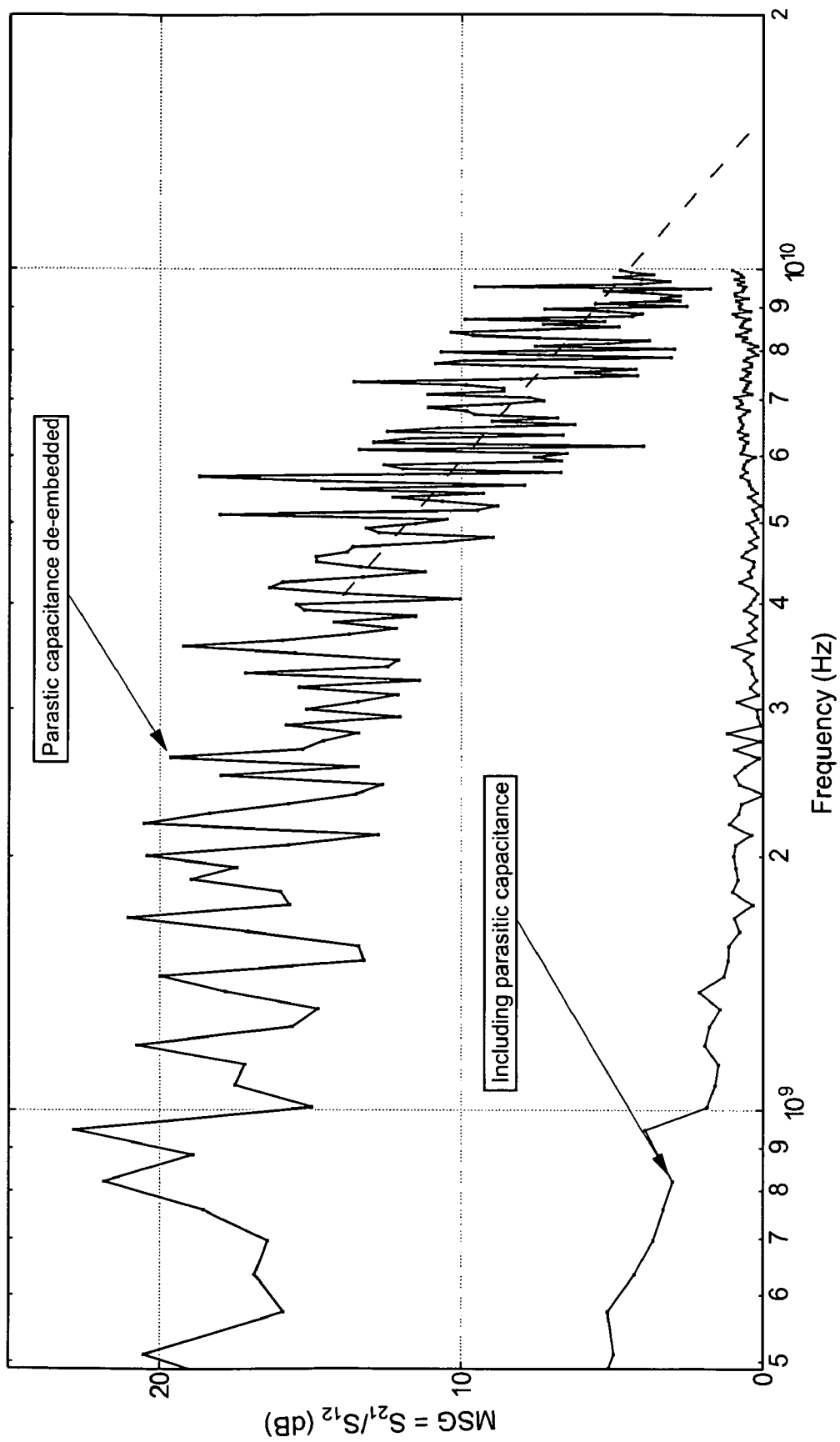
FIG. 7 is a graphical representation of the MSG before and after de-embedding the parasitic capacitance in an exemplary multifinger carbon nanotube field-effect transistor (CNT FET) formed in accordance with the present disclosure.

A second common figure of merit for characterizing HF transistors is the frequency at which the maximum stable gain (defined as $S_{21}/S_{12}$) drops to 0 dB. The conditions on stability and $f_{MAX}$ depend on all four S parameters, so this is not always a direct measure of $f_{MAX}$, the maximum frequency of oscillation. However, it is fairly straightforward to measure as $S_{21}$ and $S_{12}$ are measured, and so it is commonly used as a "poor man's" figure of merit. Referring now to FIG. 7, a graphical illustration is provided of the maximum stable gain (MSG) before and after de-embedding the parasitic capacitances. The curve extrapolates to 15 GHz, which is one of the highest MSGs ever reported for a nanotube device.

The present inventors have clearly established that the de-embedded cut-off frequency may be useful for measuring ultimate performance of the multifinger CNT FET 100. In a real circuit as soon as electrodes are attached to the multifinger CNT FET 100, the electrodes must also be accounted for in any application, especially in nanocircuits. In other words, while the de-embedded performance of the multifinger CNT FET 100 may be outstanding, it can be critical to quantify and characterize any contacting electrodes before the multifinger CNT FET 100 can be used in an actual circuit. More importantly, the above-described measurements clearly establish that transistor action persists all the way to 10 GHz in the multifinger CNT FET 100. In alternative embodiments, minimization of the parasitics can be employed to establish more sophisticated RF circuit models for the nanotube intrinsic performance.

Figure 8:
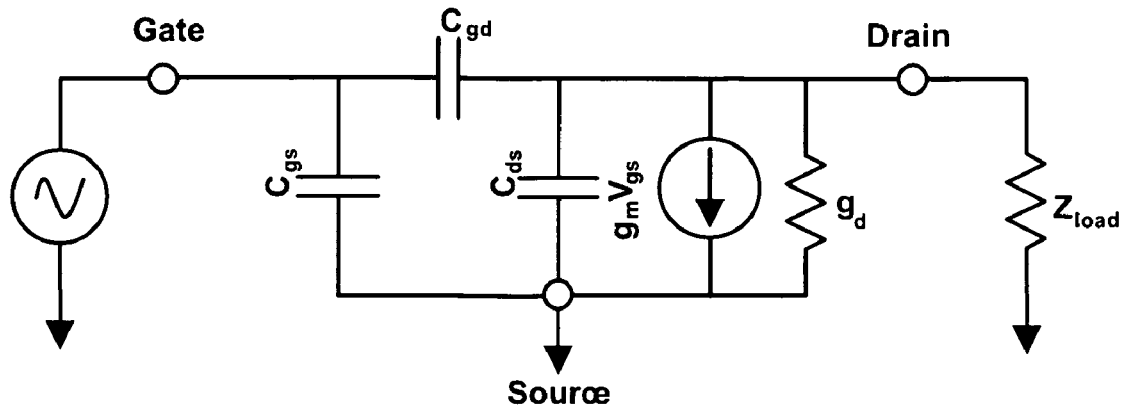
FIG. 8 is a circuit diagram showing the multifinger carbon nanotube field-effect transistor (CNT FET) in an exemplary circuit used to amplify RF signals and drive a load in accordance with one embodiment of the present disclosure.

In one or more embodiments, the multifinger CNT FET 100 can be used in a circuit in order to amplify RF signals and drive a load, as illustrated in the circuit diagram of FIG. 8. In one or more embodiments, the load is a 50 ohm load, such that a nanotube amplifier is provided for driving a 50 ohm load. Prior art nanotube devices could not realize any more power than approximately 1 mW, where the nanotube device of the present disclosure is scalable to multiple W devices for applications in power amplifiers. The gain for this circuit is represented by the equation:

$$\text{Gain}=2g_m Z_{load} \| g_d$$

Figure 9:
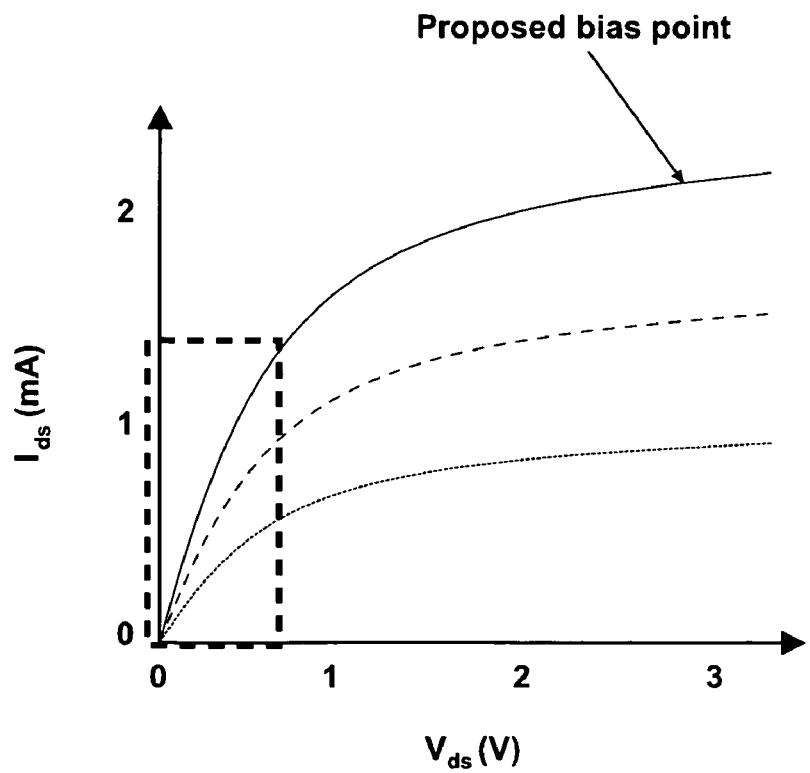
FIG. 9 illustrates the I-V characteristics for the circuit of FIG. 8.

Gains have been achieved for values<1 based on the following inputs: $g_m=1$ mS, $Z_{load}=50\Omega$, and $g_d=300\Omega$. Gains>1 are believed to be achievable using inputs such as $g_m=1$ mS, $Z_{load}=1$ k$\Omega$, and $g_d=10$ k$\Omega$ using an impedance matching circuit and a high quality dielectric to bias the circuit into saturation. The anticipated bias point for this increased gain is illustrated in the plot of I-V characteristics shown in FIG. 9.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A multifinger nanotube field-effect transistor, comprising:
   multiple nanotubes formed on a substrate; and
   a combined field-effect transistor formed over the multiple nanotubes, the combined field-effect transistor further comprising:
      a source electrode having a plurality of source finger electrodes extending there from;
      a drain electrode having a plurality of drain finger electrodes extending there from;
      a gate electrode having a plurality of gate finger electrodes extending there from;
      wherein each of the source finger electrodes, the drain finger electrodes and the gate finger electrodes are arranged in parallel and adjacent to one another extending over the multiple nanotubes so as to form a plurality of individual field-effect transistor devices arranged and electrically connected in parallel;
   wherein the multiple nanotubes are formed between the source and drain finger electrodes in each of the plurality of individual field-effect transistor devices.

2. The multifinger nanotube field-effect transistor of claim 1, wherein the multiple nanotubes comprise a randomly oriented single walled nanotubes.

3. The multifinger nanotube field-effect transistor of claim 1, wherein the multiple nanotubes comprise an array of multiple aligned single walled nanotubes.

4. The multifinger nanotube field-effect transistor of claim 1, further comprising no geometrical overlap between the gate and drain finger electrodes over the substrate.

5. The multifinger nanotube field-effect transistor of claim 4, wherein the source, drain and gate finger electrodes are arranged such that there is a source-drain gap between each source finger electrode and a corresponding adjacent drain finger electrode, wherein the source-drain gap is wider than a width of a corresponding gate finger electrode positioned adjacent to the source-drain gap, so as to minimize the Miller capacitance (Cgd) between the gate and drain finger electrodes.

6. The multifinger nanotube field-effect transistor of claim 1, wherein the combination of the plurality of parallel field-effect transistor devices having multiple parallel finger electrodes provides a lower output impedance for the combined multifinger nanotube field-effect transistor.

7. The multifinger nanotube field-effect transistor of claim 1, wherein the combined field-effect transistor includes x source finger electrodes, x drain finger electrodes, and y gate finger electrodes, where y>x>1, in order to form 2x individual field-effect transistor devices arranged and electrically connected in parallel.

8. The multifinger nanotube field-effect transistor of claim 1, wherein each of the source, drain and gate electrodes possess a respective width that is larger than a length of their corresponding source, drain and gate finger electrodes in order to minimize the resistance and inductance of the lead electrodes.

* * * * *